United States Patent
Tseng et al.

(10) Patent No.: US 6,397,373 B1
(45) Date of Patent: May 28, 2002

(54) EFFICIENT DESIGN RULE CHECK (DRC) REVIEW SYSTEM

(75) Inventors: Fouriers Tseng, Hsin-Chu; Chin-Kai Liu, Taichung, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/351,242

(22) Filed: Jul. 12, 1999

(51) Int. Cl.$^7$ .............................................. G06F 17/50
(52) U.S. Cl. ......................................................... 716/5
(58) Field of Search ............................................. 716/5

(56) References Cited

U.S. PATENT DOCUMENTS

| | | | |
|---|---|---|---|
| 4,969,198 A | * 11/1990 | Batchelder et al. | 382/147 |
| 5,062,054 A | * 10/1991 | Kawakami et al. | 716/11 |
| 5,608,816 A | * 3/1997 | Kawahara et al. | 382/149 |
| 5,681,674 A | * 10/1997 | Fujimoto | 430/5 |
| 5,705,301 A | * 1/1998 | Garza et al. | 430/5 |
| 5,784,484 A | * 7/1998 | Umezawa | 382/148 |
| 6,063,132 A | * 5/2000 | DeCamp et al. | 716/5 |
| 6,078,737 A | * 6/2000 | Suzuki | 716/19 |

OTHER PUBLICATIONS

Suzuki et al.; "A practical online design rule checking system"; IEEE Proc Design Automation Conf.; pp. 246–252, Jun. 1990.*

Lu et al.; "A new algorithm for sorting problem with reformed CAM"; IEEE ISCAS '95; pp. 1045–1048, Apr. 1995.*

Bamji et al.; "CLOVE: a graph–based layout verfiier"; IEEE Proc. 7th Int. Conf. VLSI Design; pp. 215–220, Jan. 1994.*

Pelz; "An interpreter for general netlist design rule checking"; IEEE Proc. ACM/IEEE Design Auto. Conf.; pp. 305–310, Jun. 1992.*

* cited by examiner

*Primary Examiner*—Kevin J. Teska
*Assistant Examiner*—Hugh Jones
(74) *Attorney, Agent, or Firm*—George O. Saile; Stephen B. Ackerman; Graham S. Jones, II

(57) ABSTRACT

A method/system is provided for performing a design review checking operation and analyzing the resultant data. Perform a DRC operation describing chip features and generating flags for violation sites including patterns and paths. Execute pattern analysis and grade classification steps for the violation sites. Generate a vector array for each chip feature for each of the violation sites. Compare the vector arrays to determine whether degrees of similarity of geometries of chip features of violation sites meet one of a set of criteria. Classify the violation sites into classes with similar criteria. Select representative arrays from each class of violation sites to provide an output. Calculate distance from a violation site from the origin in a two-dimensional array. Give a grade to each vector array to indicate the level of seriousness of the rule violation by the site. Use a layout viewer to view the error flags generated by pattern analysis and grade classification steps.

4 Claims, 3 Drawing Sheets

EFFICIENT DESIGN RULE CHECK (DRC) REVIEW SYSTEM

BACKGROUND OF THE INVENTION

1. Field of the Invention

This invention relates to a manufacturing process and more particularly to Design Rule Checking in a manufacturing process.

2. Description of Related Art

U.S. Pat. No. 5,440,720 of Baisuck et al., assigned to Cadence Design Systems, for "Architecture and Method for Data Reduction in a System for Analyzing Geometric Databases" shows a method for data reduction.

U.S. Pat. No. 5,483,603 of Luke et al. for "System and Method for Automatic Optical Inspection" shows a method for automatic optical inspection.

U.S. Pat. No. 5,590,049 assigned to Cadence Design Systems of Arora for "Method and System for User Programmable Design Verification for Printed Circuit Boards and Multichip Modules" shows a method for design verification.

U.S. Pat. No. 5,613,102 of Chiang et al. "Method for Compressing Data for Use in Performing VLSI Mask Layout Verification" teaches a method for compressing data for layout verification.

U.S. Pat. No. 5,754,826 of Gamal et al for "CAD and Simulation System for Targeting IC Designs to Multiple Fabrication Processes" describes Design Review Check (DRC) using Dracula (TM) from Cadence starting with a GDSII file (a polygon level description). Errors are reported.

U.S. Pat. No. 5,764,793 of Omae et al. for "Method of and Apparatus for Inspecting Pattern Defects" describes a design rule check circuit for "DRC" inspection which uses a compare check method relative to a reference pattern image.

U.S. Pat. No. 5,781,446 of Wu for "System and Method for Multi-Constraint Domain Electronic System Design Mapping" describes at Col. 2, lines 29–39, a physical spacing DRC performed to verify that adequate spacing exists between adjacent components to accommodate conductor routing channels or the handling head of a pick-and-place PCB manufacturing system.

U.S. Pat. No. 5,787,006 of Chevallier et al. for "Apparatus and Method for Management of Integrated Circuit Layout Verification Processes" describes DRC and Layout Versus Schematic (LVS) verification procedures, in considerable detail.

SUMMARY OF THE INVENTION

A method of reviewing a Design Rule Check (DRC) for every new coming product is very important in contemporary fabrication plants.

However with in currently available review methods for use with the Design Rule Check (DRC), one needs to view error flags one-by-one. This is almost impossible to view all for any chips which is designed by current chip design methodology.

This invention provides a new way to overcome this problem by revising the current method.

In view of the very large scale of contemporary integrated circuit devices, it is so time consuming that it is almost impossible to view all error flags one-by-one, with the current state of the art of chip design methodology where thousands of error flags may be present. This invention provides a method for overcoming the problem of viewing error flags with a reasonable expenditure of resources.

It is an object of this invention to provide DRC review with full coverage of flagged errors.

It is another object of this invention to improve the efficiency of the process of DRC review.

The present invention teaches use of the Cadence DRACULA program to run DRC using a GDSII file providing geometrical classification of patterns on a mask or reticle. A program for classification of error flags and generation of an output file grading the error flags is provided; and means and process functions are provided for viewing selected error flags.

In accordance with this invention, a method is provided for performing a design review checking operation and analyzing the resultant data comprising as follows:

Perform a Design Review Check (DRC) operation describing chip features and generating flags for violation sites including patterns and paths.

Execute pattern analysis and grade classification steps for the violation sites.

Generate a vector array for each chip feature for each of the violation sites.

Compare the vector arrays to determine whether the degree of similarity of geometries of chip features of violation sites meets one of a set of criteria.

Classify the violation sites into classes with similar criteria.

Select representative arrays from each class of violation sites to provide an output.

Calculate distance from a violation site from the origin in a two-dimensional array.

Give a grade to each vector array to indicate the level of seriousness of the rule violation by the site.

Use a layout viewer to view the error flags generated by pattern analysis and grade classification steps.

BRIEF DESCRIPTION OF THE DRAWINGS

The foregoing and other aspects and advantages of this invention are explained and described below with reference to the accompanying drawings, in which:

FIGS. 3 and 4 show flow charts for a system executing a pattern and grade classification process which is described in more detail in FIG. 4.

DESCRIPTION OF THE PREFERRED EMBODIMENT

In accordance with this invention, in the process of this invention a DRC operation is performed using a GDSII input file, or otherwise. Then, the violation sites found in the DR(C check are marked on a graph for the purpose of classification of the violation sites.

Figure 1:
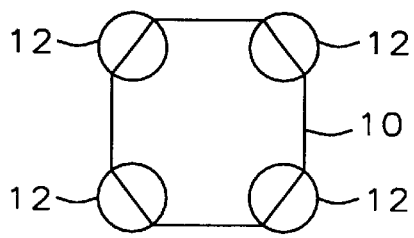
FIG. 1 shows a graph of a form which represents a violation site comprising an eight-sided polygon with four corner areas, each of which corner areas is marked with a circle.

FIG. 1 shows a graph of a form 10 which represents a violation site comprising an eight-sided polygon with four corner areas, each of which corner areas is marked with a circle 12. Polygon 10 is an example of a form, identified as a violation site, which can be classified by a classification program in accordance with this invention. The distance of a violation site is calculated, and the violation site is given a grade to indicate the level of seriousness of the rule violation site. A layout viewer is used to view error flags generated by the above steps.

Figures 2A, 2B:
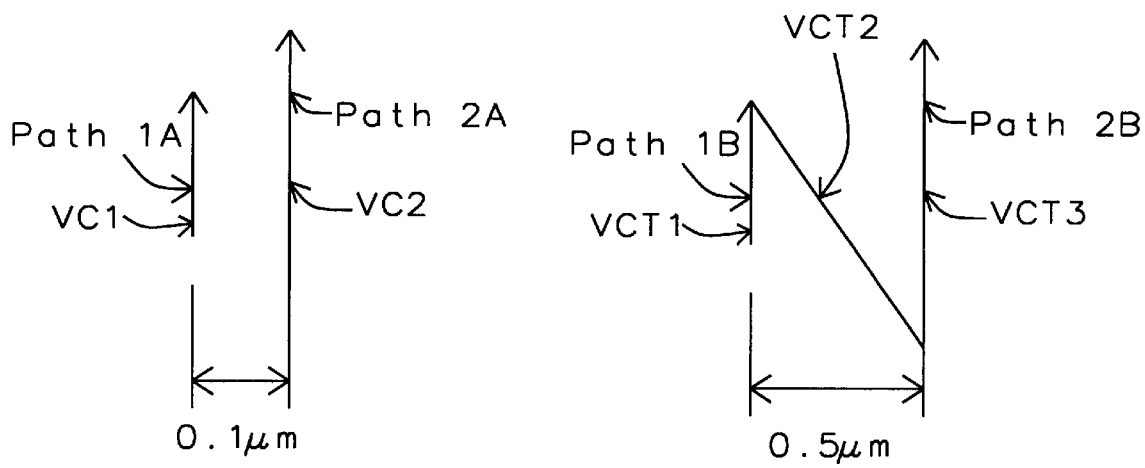
FIG. 2A shows a path vector parallel to another path vector with a spacing of only 0.1 $\mu$m between vectors.
FIG. 2B shows a path vector parallel to another path vector with a spacing of 0.5 $\mu$m between path vectors and a diagonal vector.

Referring to FIGS. 2A and 2B, the classification program is applicable to paths, as well as to polygons. Patterns are defined as the same pattern, if their geometries are the same.

FIG. 2A shows Path 1A (vector VC1) parallel to Path 2A (vector VC2) with a spacing of only 0.1 $\mu$m between vector VC1 and vector VC2.

FIG. 2B shows Path 1B (vector VCT1) parallel to Path 2B (vector VCT3) with a spacing of 0.5 $\mu$m between vector VCT1 and vector VCT3 and a diagonal vector VCT2.

A classification program of the kind employed in industry today will define the pattern of FIG. 2A to have the same general shape as the pattern of FIG. 2B, but the pattern of FIG. 2A is given a higher violation level since it is a worse violation (i.e. 0.1 $\mu$m vs. 0.5 $\mu$m).

The present invention is intended to deal with the scale difference between FIG. 2A and FIG. 2B and to resolve that difference.

Figure 3:
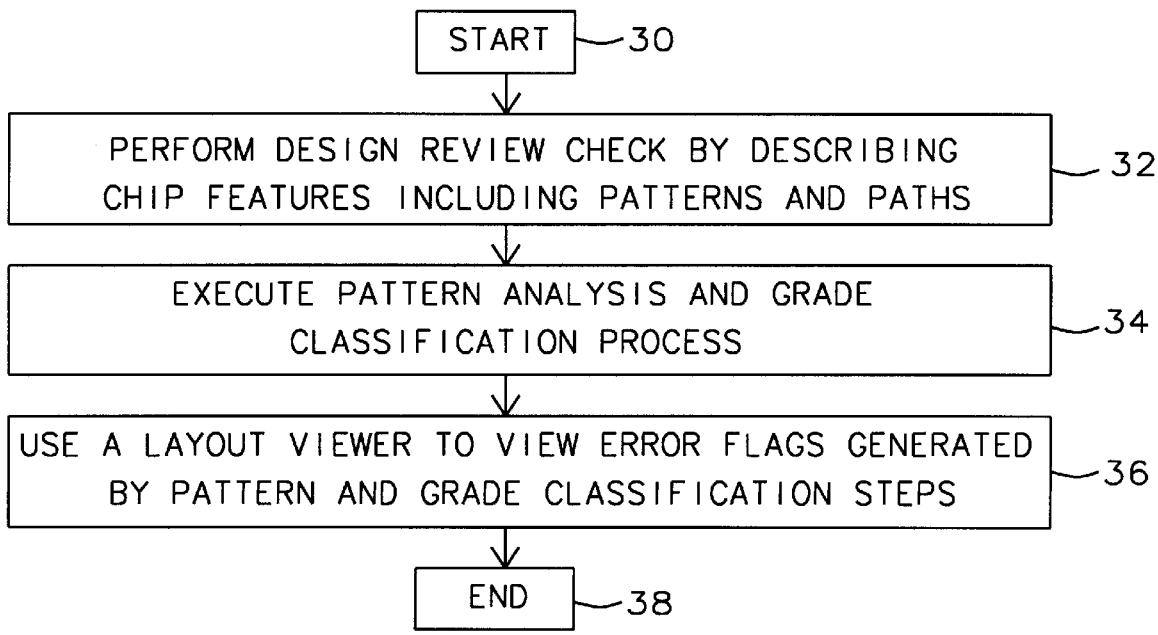
FIG. 3 shows a flow chart of the broad features of a program in accordance with this invention.

FIG. 3 shows a flow chart of the broad features of a program in accordance with this invention which starts with block 30.

DRC Check

Referring to FIG. 3, in block 32, a Design Review Check (DRC) operation describing chip features including patterns and paths in accordance with this invention is initiated by use of the Cadence DRACULA system which is used to run a DRC. The output file format can be set up in accordance with the GDSII format.

The DRACULA system is described in DRACULA Reference Manual, Vols. 1–3 available from Cadence Design Systems, Inc., 555 River Oaks Parkway, San Jose, Calif. 95134, which are incorporated by reference herein. When using the Cadence DRACULA (TM) program, we use the GDSII Stream data format (Release 6.0) the most commonly used format for Ebeam lithography and photomask reproduction, as described in the P. Rai-Choudhury, "SPIE Handbook of Microlithography, Micromachining and Microfabrication, Vol. I, Microlithography," published by SPIE Vol. PM39. A GDSII file (provides a polygon level description as described in Gamal et al U.S. Pat. No. 5,754,826 for "CAD and Simulation System for Targeting IC Designs to Multiple Fabrication Processes"The GDSII file is used as an input file or set up for the output file format as GDSII format as will be well understood by those skilled in the art.

Pattern and Grade Classification

After finishing the DRC execution, in block 34 a pattern analysis and grade classification program is run to distinguish all different pattern types being considered. At this stage a viewer would think the patterns are the same if their size and shape are generally the same as in FIGS. 2A and 2B, as described above.

Figure 4:
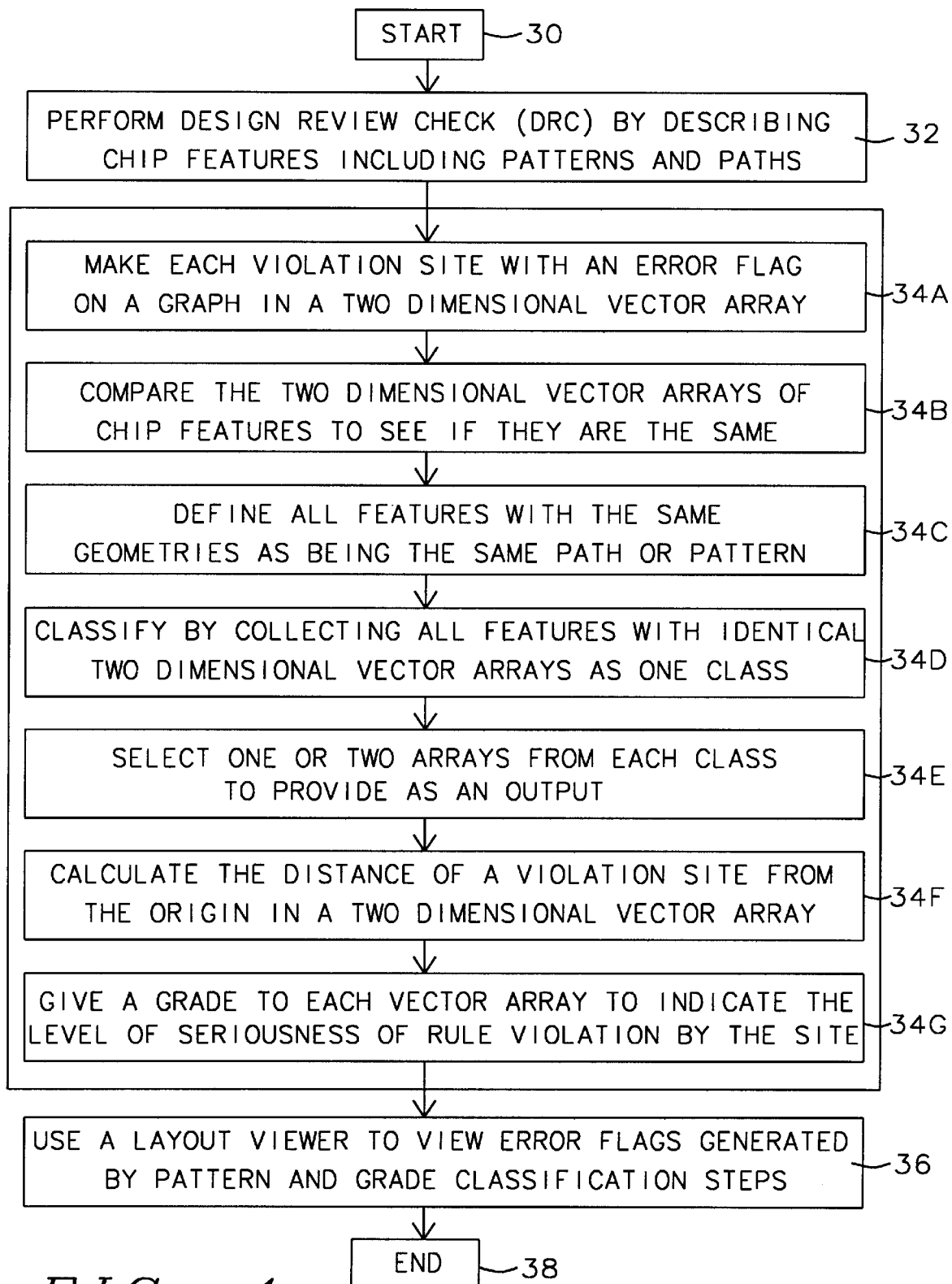

Block 34 shown in FIGS. 3 and 4, covers steps which are a major key to this invention. In current chip design technology, a designer can use a hierarchical method to design a chip. When one cell violates the rule, that violation causes many error flags in the DRC output file. In the long procedure required in the absence of this invention, one would review all error flags which number in the thousands. In accordance with this invention, it is enough to review one or two representative error flags. One can distinguish the violation level of each class.

Next in step 34 as shown in FIGS. 3 and 4 (which show flow charts for a system) the system executes a pattern and grade classification process which is described in more detail in FIG. 4.

1. When the Cadence DRACULA program is used to run a DRC, in accordance with this invention, a GDSII file is used as an input file or to set up the output file format in the GDSII format.

2. After finishing the DRC execution, we run a pattern classification program to distinguish all different pattern types. A general concept is that if patterns have the same size and shape the are classified as being the same which is a key aspect of this invention. In current chip design, the designers use hierarchichal methods for designing their chips. When one cell violates our rule, that will generate many error flags in the DRC output file. In the traditional way, one needs to review all violations. But in accordance with this invention, it is enough to review one or two violations. One can distinguish the violation level of each class.

Table I shows an example of the number of errors flagged for a single chip reticle using GDSII, Version 3.

TABLE I

| GDSII Version = 3. | | | ERROR run date 980409. |
|---|---|---|---|
| 1. Error name = NWW01 | Instance number | 5008 | Class number 1 |
| 2. Error name = NWS02 | Instance number | 4 | Class number 2 |
| 3. Error name = ODC02 | Instance number | 3681 | Class number 231 |
| 4. Error name = ODC04 | Instance number | 7027 | Class number 137 |
| 5. Error name = M1W01 | Instance number | 136 | Class number 4 |
| 6. Error name = M1S01 | Instance number | 139067 | Class number 245 |
| 7. Error name = M1S02 | Instance number | 525 | Class number 19 |
| 8. Error name = M2S02 | Instance number | 1265 | Class number 61 |
| 9. Error name = M3S02 | Instance number | 72 | Class number 18 |
| 10. Error name = CBW01 | Instance number | 432 | Class number 2 |
| 11. Error name = CBS01 | Instance number | 254 | Class number 3 |
| 12. Error name = ESDC02 | Instance number | 3116 | Class number 9 |
| | TOTAL | 160,587 | TOTAL 732 |

One database unit is equal to 1e-09 meters.

We can see that we just need to review about 732 error sites instead of 160,587 error sites if we use the method of this invention. Thus the above classification procedure, the system reduces the number of objects to be reviewed by about a number of orders of magnitude since 160,587 is 219 times as large as 732.

Then in step 36 in FIGS. 3 and 4, the system presents on a layout viewer images permitting the designer to view on a layout viewer error flags generated by pattern and grade classification steps 34A–34G. TABLE II shows that it is easy to know the violation level.

TABLE II

| 1 | -2.23 | -3.58 | M1SEP01A CL--1 | 0.050000 |
|---|---|---|---|---|
| 2 | -2.23 | -3.58 | | |

TABLE II-continued

| 3 | −2.23 | −3.58 | M1SEP01D CL--2 | 0.550000 |
| 4 | −2.23 | −3.58 |  |  |
| 5 | −2.23 | −3.18 | M1SEP01D CL--3 | 0.550000 |
| 6 | −2.23 | −3.18 |  |  |

At this stage, we can furthermore review just one of tenth of the listed objects.

Finally in step 38, the program ends.

A key procedure for error flags classification used in step 2 of previous operation procedure as described below in connection with FIG. 4.

Process Steps

FIG. 4 shows the flow chart of FIG. 3 in more detail. In step 30 the program starts.

Next follows step 32 in which the system performs a design review-check (DRC) by describing chip features including patterns and paths.

Then the system commences step 34 in FIG. 3 with step 34A in which the system marks each violation site with an error flag on a graph in a two-dimensional vector array.

In block 34B, the system compares the two-dimensional vector arrays of chip features to see if they are the same.

In block 34C, the system defines all chip features with the same geometries as being the same path or pattern.

In block 34D, the system classifies by collecting all features with identical two-dimensional vector arrays as one class.

In block 34E, the system selects one or two arrays from each class to provide as an output.

In block 34F, the system calculates the distance of a violation site from the origin in a two-dimensional vector array.

In block 34G, the system gives a grade to each vector array to indicate the level of seriousness of the rule violation by the site.

In block 36, the system permits the operator to use a layout viewer to view error flags generated 36 by pattern and grade classification steps.

In summary in FIG. 4, based on the output format of Cadence DRACULA II, block 34 uses a procedure for classification as follows:
1. Transfer all error flags into a two dimensional (2-D) vector array for path or polygon type (block 34A, FIG. 4).
2. The computer system compares the vector arrays (block 34B, FIG. 5) to see which ones of the vector arrays are sufficiently identical or sufficiently similar to fall within a given classification (block 34C, FIG. 5).
3. Classify the arrays of collections of sufficiently identical or sufficiently similar 2-D vector arrays in groups (block 34D, FIG. 5) with each group comprising a single class and select one or two vector arrays form each group to serve as representative output data (block 34E, FIG. 5).
4. Measure the distance or area of each error (block 34F, FIG. 5), and give the violation grade (block 34G, FIG. 5).

System Configuration

Figure 5:
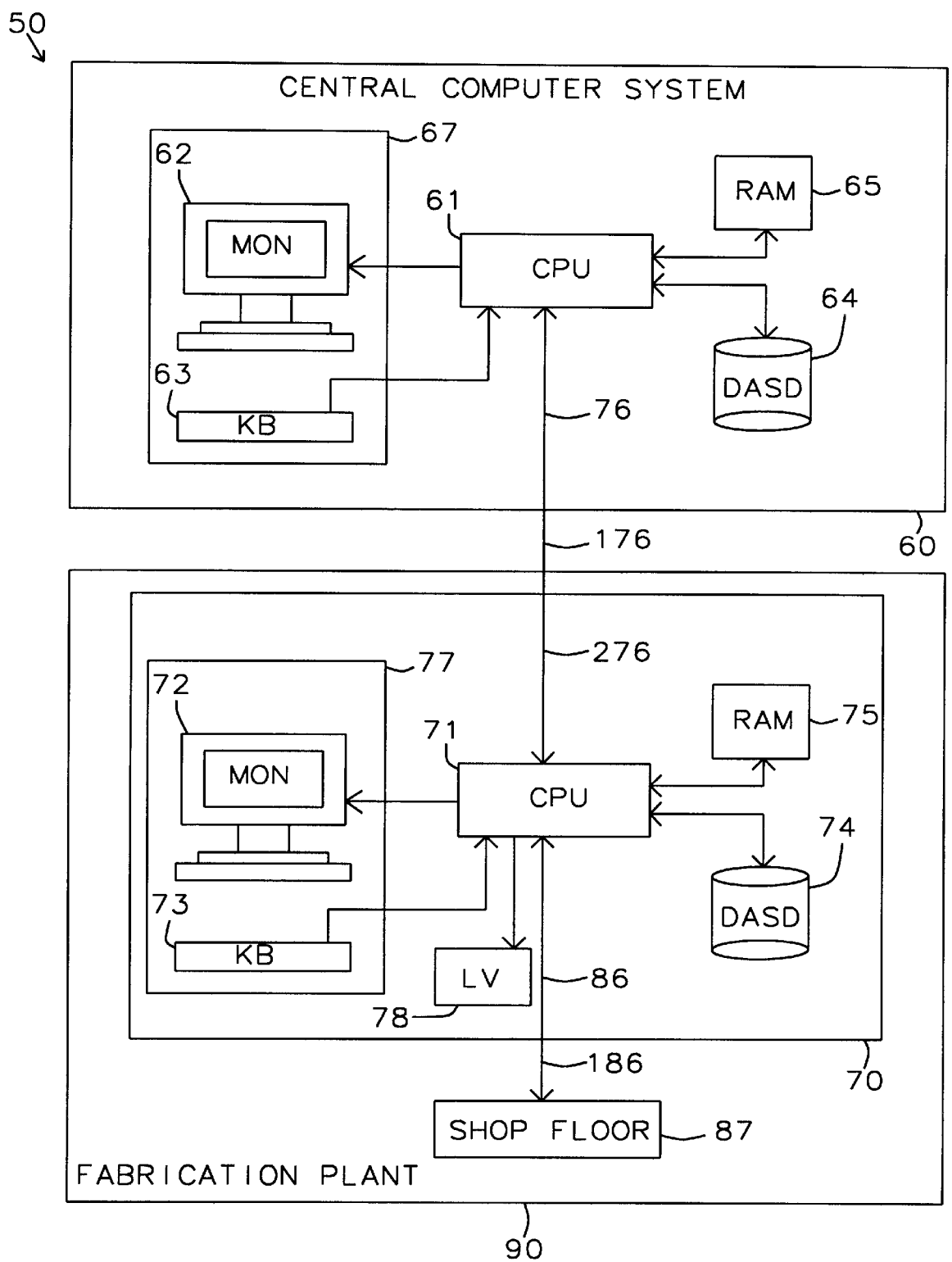
FIG. 5 shows a manufacturing plant which includes a central computer system and a fabrication plant with a shop floor where products, such as semiconductor chips, are being manufactured and a computer system for allocating the plant resources in accordance with this invention.

FIG. 5 shows a manufacturing plant 50 which includes a central computer system 60 and a fabrication plant 90 with a shop floor 87 where products, such as semiconductor chips, are being manufactured and a computer system 70 for allocating fabrication plant resources in accordance with this invention.

The computer program of FIG. 4 in accordance with this invention is preferably resident in a site in the fabrication plant computer system 70 which is preferably connected, as shown in FIG. 5, as a part of the overall computer system with the central computer system 60, which is an alternative site for the computer program of FIG. 4

Referring again to FIG. 5, the computer system 70 operates as an integral part of the fabrication plant 90 and so it is shown located within the plant 90, but it may be located elsewhere, as will be obvious to those skilled in the art and it can be a portion of an overall consolidated system incorporating the central computer system 60 and can operate independently as a matter of choice.

The central computer system 60 shown in FIG. 5 comprises a CPU (Central Processing Unit) 61, a terminal 67 with a monitor 62 connected to the CPU 61 for receiving data from the CPU 61 and a keyboard 63 connected to the CPU 61 for sending data respectively to the CPU 61. A RAM (Random Access Memory) 65 and a DASD 64 associated with the CPU 61 are shown connected for bidirectional communication of data to and from CPU 61.

Lines 76, 176 and 276 provide for interconnections between the CPU 61 of system 60 to the CPU 71 of the fabrication plant computer system 70. Line 176 connects between lines 76 and 276 at the interfaces of computer 60 and a factory control computer system 70 respectively.

The factory control computer system 70 comprises a CPU 71, a terminal 77 with monitor 72 connected to the CPU 71 for receiving data respectively from the CPU 71 and keyboard 73 connected to the CPU 71 for sending data respectively to the CPU 71. A random access memory 75 and a DASD 74 associated with the CPU 71 are shown connected for bidirectional communication of data to and from CPU 71. Line 86 connects from CPU 71 to line 186 connects through the factory control computer 70 interface to the shop floor system 87. A layout viewer 78 is connected to the CPU 71 to display error flags generated by the pattern for used by the operator of the computer system 70.

The system 50 includes the data defining the Master Production Schedule (MPS) and the Key Stage Report (KSR) for the plant 90 stored in one of the DASD unit 64, DASD unit 74 RAM 65 or RAM 75, as desired, in a conventional manner, as will be well understood by those skilled in the art.

Summary

This invention provides for execution of an error flag classification program and output classification file involving a Design Rule Check (DRC) and pattern classification.

An advantage of this invention is that it dramatically reduces the number of objects that need to be reviewed.

There is full coverage DRC review and improvement in DRC review efficiency.

Any layout viewer can be used to view error flags generated in the Cadence DRACULA II output.

During above classification, we reduce 3 order of objects to be reviewed. At this stage, we can furthermore just to review one of tenth of the list objects. A procedure can be used by the system to do classification as follows:
1. Transfer all error flags into 2-D vector array for path or polygon type.
2. Compare these to see if they are same.
3. Collect same—2-D vector arrays as one class and select one or two vector arrays to output.
4. Measure the distance or area of each error, and give violation grade.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method for performing a design review checking operation and analyzing the resultant data comprising:

performing a Design Review Check (DRC) operation describing chip features and generating flags for violation sites including patterns and paths, executing pattern analysis and grade classification steps for the violation sites, using a layout viewer to view the error flags generated by the pattern and grade classification steps, generating a vector array for chip features for each of the violation sites, comparing the vector arrays to determine whether the degree of similarity thereof meets one of a set of criteria, classifying the violation sites into classes with similar criteria, selecting representative arrays from each class of violation sites to provide an output, calculating distance from a violation site from the origin in a two-dimensional array, and giving a grade to each vector array to indicate the level of seriousness of the rule violation by the site.

2. A method for performing a design review checking operation and analyzing the resultant data comprising:

performing a Design Review Check (DRC) operation describing chip features and generating flags for violation sites including patterns and paths, executing pattern analysis and grade classification steps for the violation sites, using a layout viewer to view the error flags generated by the pattern and grade classification steps, generating a vector array for each chip feature for each of the violation sites, comparing the vector arrays to determine whether the degree of similarity of geometries of chip features of violation sites meets one of a set of criteria, classifying the violation sites into classes with similar criteria, selecting representative arrays from each class of violation sites to provide an output, calculating distance from a violation site from the origin in a two-dimensional array, and give a grade to each vector array to indicate the level of seriousness of the rule violation by the site.

3. A method for performing a design review checking operation and analyzing the resultant data comprising:

performing a Design Review Check (DRC) operation describing chip features and generating flags for violation sites including patterns and paths, executing pattern analysis and grade classification steps for the violation sites, using a layout viewer to view the error flags generated by the pattern and grade classification steps, generating a vector array for chip features for each of the violation sites, comparing the vector arrays to determine whether the degree of similarity thereof meets one of a set of criteria, and classifying the violation sites into classes with similar criteria, selecting representative arrays from each class of violation sites to provide an output, calculating distance from a violation site from the origin in a two-dimensional array, giving a grade to each vector array to indicate the level of seriousness of the rule violation by the site, and then using the layout viewer to view error flags generated.

4. A method for performing a design review checking operation and analyzing the resultant data comprising:

performing a Design Review Check (DRC) operation describing chip features and generating flags for violation sites including patterns and paths, executing pattern analysis and grade classification steps for the violation sites, using a layout viewer to view the error flags generated by the pattern and grade classification steps, generating a vector array for each chip feature for each of the violation sites, comparing the vector arrays to determine whether the degree of similarity of geometries of chip features of violation sites meets one of a set of criteria, and classifying the violation sites into classes with similar criteria, selecting representative arrays from each class of violation sites to provide an output, calculating distance from a violation site from the origin in a two-dimensional array, give a grade to each vector array to indicate the level of seriousness of the rule violation by the site, and use a layout viewer for viewing error flags generated.

* * * * *